(12) United States Patent
Spica

(10) Patent No.: US 6,717,428 B1
(45) Date of Patent: Apr. 6, 2004

(54) METHOD AND APPARATUS FOR DETECTING DEFECTS IN A CIRCUIT USING SPECTRAL ANALYSIS OF TRANSIENT POWER SUPPLY VOLTAGE

(75) Inventor: Michael Spica, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/705,073

(22) Filed: Nov. 2, 2000

(51) Int. Cl.$^7$ ............................................. G01R 31/28
(52) U.S. Cl. .................................... 324/765; 324/158.1
(58) Field of Search .............................. 324/765, 73.1, 324/158.1, 76.24; 714/733, 734, 730; 702/85, 76, 77, 126

(56) References Cited

U.S. PATENT DOCUMENTS

| | | | | |
|---|---|---|---|---|
| 4,415,852 A | * | 11/1983 | Ashley et al. | 333/223 |
| 5,179,344 A | * | 1/1993 | Najle et al. | 324/613 |
| 5,671,147 A | * | 9/1997 | McKim et al. | 702/77 |
| 5,949,798 A | * | 9/1999 | Sakaguchi | |
| 6,043,662 A | * | 3/2000 | Alers et al. | 324/520 |
| 6,246,248 B1 | * | 6/2001 | Yamagishi | 324/763 |

OTHER PUBLICATIONS

Baker, K., et al., "Defect–Based Delay Testing of Resistive Vias–Contacts a Critical Evaluation", *ITC International Test Conference, IEEE*, 467–476, (1999).

Cole, E.I., et al., "Transient Power Supply Voltage (vDDT) Analysis for Detecting IC Defects", *International Test Conference, IEEE*, 23–31, (1997).

Germida, A., et al., "Defect Detection using Power Supply Transient Signal Analysis", *ITC International Test Conference, IEEE*, 67–76, (1999).

Gielen, G., et al., "Fault Detection and Input Stimulus Determination for the Testing of Analog Integrated Circuits Based on Power–Supply Current Monitoring.", *ACM*, 495–498, (1994).

Jiang, W., et al., "Statistical Threshold Formulation For Dynamic Idd Test", *ITC International Test Conference, IEEE*, 57–66, (1999).

Kruseman, B., et al., "Transient Current Testing of 0.25$\mu$m CMOS Devices", *ITC International Test Conference, IEEE*, 47–56, (1999).

* cited by examiner

*Primary Examiner*—Vinh P. Nguyen
(74) *Attorney, Agent, or Firm*—Schwegman, Lundberg, Woessner & Kluth, P.A.

(57) ABSTRACT

A circuit test method and apparatus uses a spectral characteristic of a supply voltage to detect defects within a device under test (DUT). The spectral characteristic of the supply voltage is preferably measured as the DUT undergoes a predetermined operational sequence. The measured spectral characteristic value is then compared to a predetermined test criterion to determine whether the DUT is likely to include a defect.

21 Claims, 3 Drawing Sheets

METHOD AND APPARATUS FOR DETECTING DEFECTS IN A CIRCUIT USING SPECTRAL ANALYSIS OF TRANSIENT POWER SUPPLY VOLTAGE

FIELD OF THE INVENTION

The invention relates generally to circuit test procedures and, more particularly, to techniques for detecting defects in circuits at a macroscopic level.

BACKGROUND OF THE INVENTION

As part of the digital circuit manufacturing process, tests are commonly performed to detect defects within the fabricated circuits. Two types of defects that can occur in digital circuits are "stuck at" defects and delay defects. A "stuck at" defect is presently in a circuit when a portion of the circuit that is supposed to transition between logic values (e.g., from logic zero to logic one, and vice versa) during circuit operation does not transition. That is, the circuit portion is "stuck at" either a logic one value or a logic zero value. A delay defect is present when a circuit portion can transition between logic values, but the transition occurs either before or after it is supposed to. As can be appreciated, both types of defect can have a devastating effect on circuit performance and circuits having such defects should normally be identified and discarded. Delay defects are generally detected by operating a circuit at full speed while monitoring the transition activity at selected nodes in the circuit. A known test sequence is applied to the circuitry that should generate transitions at the selectable nodes within predetermined time windows. If one or more of the transitions occur outside of the corresponding time window, the circuit is deemed to have a delay defect.

As is well known, the speed at which digital circuits operate is continually increasing. Thus, to continue to perform defect tests at full operational speed in the future, higher performance test equipment will be needed. However, higher performance test equipment is typically expensive and can significantly increase the overall cost of the circuit manufacturing process. As can be appreciated, it is generally desirable to keep manufacturing costs down to increase the competitiveness of manufactured products in the marketplace by minimizing price to the consumer.

Therefore, there is a need for a method and apparatus for detecting defects within manufactured circuitry that does not require full speed operation of a device under test.

DETAILED DESCRIPTION

Figure 1:
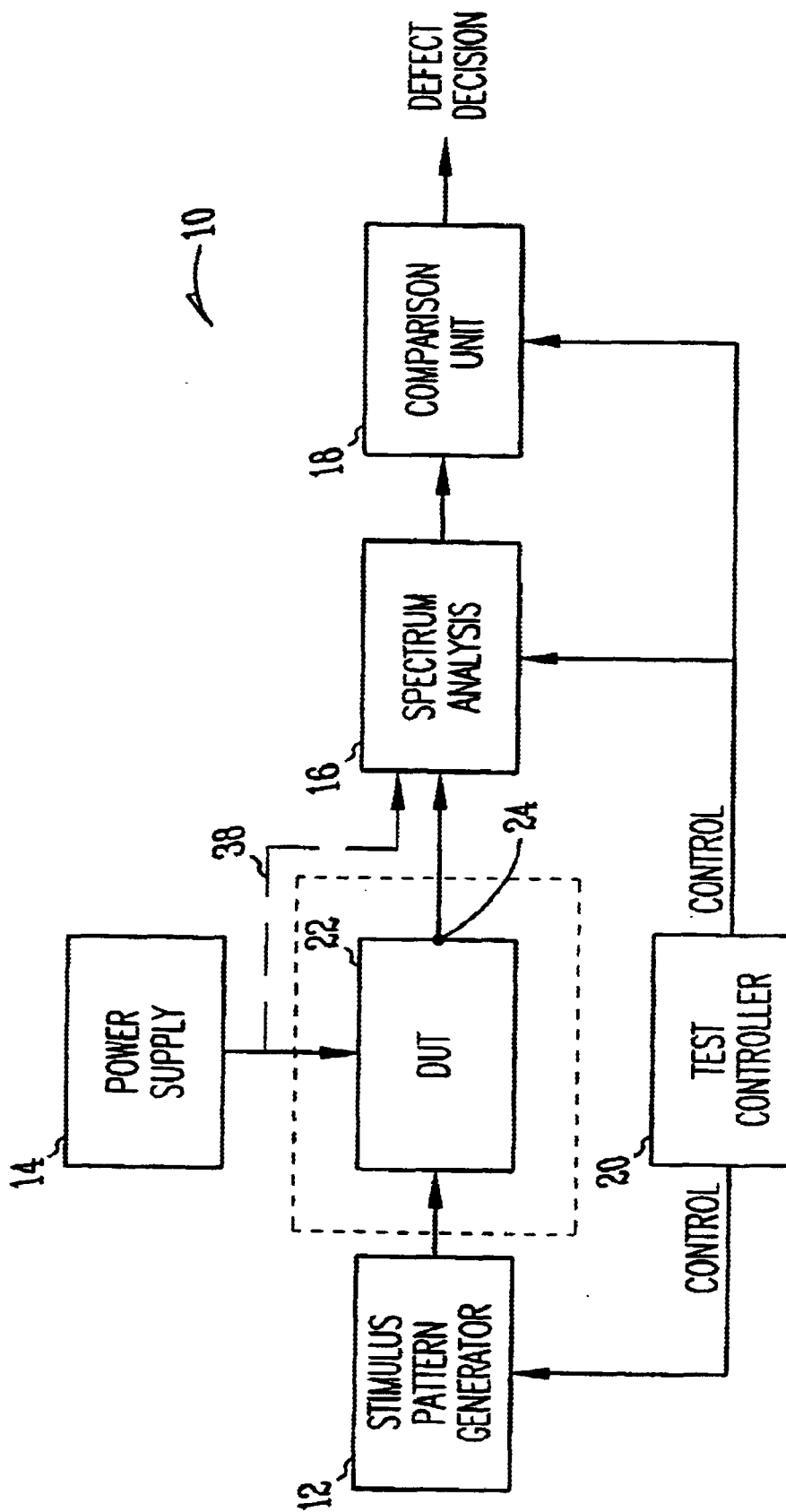
FIG. 1 is a block diagram illustrating a test system in accordance with one embodiment of the present invention.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein in connection with one embodiment may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

The present invention relates to test methods and associated test systems for detecting defects within digital integrated circuits. The principles of the present invention can be used to detect both delay and "stuck at" defects within circuits, but are particularly valuable in detecting the former. The inventive principles will typically be implemented within a manufacturing environment to identify and reject circuits that are likely to include potentially harmful defects. Significantly, the inventive principles allow one to detect defects within a circuit without having to run the circuit at full operation speed (although the techniques will also work at full operational speed). Consequently, the test station used to implement the inventive principles can utilize lower performance equipment than would otherwise be necessary to detect delay defects. As can be appreciated, the use of lower performance equipment will typically translate into a significant cost savings. In a preferred approach, the spectrum of the supply voltage being applied to a device under test (DUT) is analyzed during circuit operation to measure a spectral characteristic thereof. The spectral characteristic is then compared to a predetermined test criterion to determine whether a defect is likely to exist within the DUT. In one implementation, the predetermined test criterion is developed statistically from spectral measurements performed on circuits that are known to be defect-free. The inventive principles can be used to detect defects in a wide range of digital circuit types including, for example, digital logic circuits and digital memory circuits.

In conceiving the present invention, it was discovered that the supply voltage being applied to a digital circuit during a particular operational sequence will include a relatively predictable droop/bounce component if the circuit is behaving as expected (i.e., there are no defects present within the circuit). This droop/bounce component of the supply voltage will have an associated spectral profile that is also relatively predictable. When certain defects exist within the digital circuit, however, it was found that the droop/bounce component of the supply voltage, and its associated spectral profile, can vary from its expected form. Based on the above, it was determined that defects within a digital circuit could be detected by measuring a spectral characteristic of the supply voltage of the circuit during a particular operational sequence and comparing that spectral characteristic to a test criterion that is representative of an expected response. It was also found that the spectral characteristic that is measured to perform the test does not have to encompass the entire spectrum of the supply voltage, but can be limited to a particular portion of the spectrum, such as a small frequency band or one or more discrete frequencies. Further, it was determined that a predictable droop/bounce component would result in the supply voltage even if the digital circuit is being operated at well below the normal operating speed of the circuit. Thus, a digital circuit does not need to be run at full operational speed to test for defects in the circuit. Consequently, test equipment can be used that is much slower (and less expensive) than would otherwise be needed to test for, for example, delay defects.

FIG. 1 is a block diagram illustrating a test system 10 in accordance with one embodiment of the present invention. The test system 10 is used to detect defects within a device under test (DUT) 22 that is inserted into the system 10 prior to a test procedure. Typically, the test system 10 will be part of a larger test setup within a manufacturing environment that also tests a wide variety of other characteristics of the DUT 22. However, individual dedicated test stands are also possible. As illustrated, the test system 10 includes: a stimulus pattern generator 12, a power supply 14, a spectrum analysis unit, 16, a comparison unit 18, and a test controller 20. Prior to a test, the DUT 22 is inserted into the test system 10 where it is coupled to the power supply 14 which acts as a power source for the DUT 22 during the test. In the illustrated embodiment, the power supply 14 is a part of the test system 10. In an alternative arrangement, the power supply 14 will be an integral part of the DUT 22 itself. The stimulus pattern generator 12 is coupled to one or more inputs of the DUT 22 to deliver a stimulus pattern to the DUT 22 during the test. The spectrum analysis unit 16 measures a spectral characteristic of the supply voltage of the DUT 22 while the stimulus pattern is being applied. The comparison unit 18 compares the spectral characteristic measured by the spectrum analysis unit 6 to a predetermined test criterion to determine whether the DUT 22 is likely to include a defect. The test controller 20 controls the timing and/or operation of the other elements within the system 10.

It should be appreciated that the various blocks within the test system 10 of FIG. 1 are functional in nature and do not necessarily correspon In one embodiment, for example, the stimulus pattern generator 12, the spectrum analysis unit 16, the comparison unit 18, and the test controller 20 are each implemented in software within a common digital processing unit. Many other configurations are also possible, as will be understood by a person of ordinary skill in the art.

The stimulus pattern that is applied to the DUT 22 by the stimulus pattern generator 12 is designed to put the DUT 22 through a predetermined operational sequence. As discussed above, this predetermined operational sequence will result in a relatively predictable droop/bounce component in the supply voltage of the DUT 22 if there are no defects in the DUT 22. Depending on the type of circuits being tested, the stimulus pattern generated by the stimulus pattern generator 12 can include a single signal applied to a single input of the DUT 22 or multiple signals applied to multiple inputs thereof. For example, if the DUT 22 is a memory circuit, the stimulus pattern may include a sequence of memory addresses to be applied to the address port of the memory and a sequence of data words to be applied to the data port of the memory to be stored within the addressed memory locations. Appropriate control signals (e.g., write signals) can also be included within the stimulus pattern. As will be understood by a person of ordinary skill in the art, the type of stimulus pattern that is used can vary greatly and will generally depend upon the type of circuits being tested. As described above, the inventive principles can be used to detect defects in circuits at operational speeds that are significantly less than the maximum operational speeds of the circuits. Thus, in one embodiment of the present invention, the predetermined operational sequence resulting from application of the stimulus pattern to the DUT 22 takes place at an operational speed that is significantly less than the maximum operational speed of the DUT 22.

As described above, the spectrum analysis unit 16 measures a spectral characteristic of the supply voltage of the DUT 22 while the stimulus pattern is being applied to the DUT 22 (i.e., during the predetermined operational sequence). The supply voltage that is analyzed by the spectrum analysis unit 16 will be the voltage that is applied to the DUT 22 by the power supply 14, or a derivative thereof. Preferably, the DUT 22 will include an output terminal 24 (e.g., a pin) that can be directly coupled to the spectrum analysis unit 16, although a direct connection 38 between the spectrum analysis unit 16 and the power supply 14 can alternatively be used. In one approach, the spectrum analysis unit 16 measures a characteristic associated with a single discrete frequency, a plurality of discrete frequencies, or one or more small frequency bands within the spectrum of the supply voltage. The spectrum analysis unit 16 may also limit the spectral measurement to a particular time window during the predetermined operational sequence of the DUT 22. The time window may be selected to coincide, for example, with a known period of heavy transitional activity within the DUT 22 during the predetermined operational sequence (i.e., a period during which many logic transitions are occurring within the DUT 22). The time window can be referenced from, for example, the initiation of the stimulus pattern. The timing can be controlled by the test controller 20.

Figure 2:
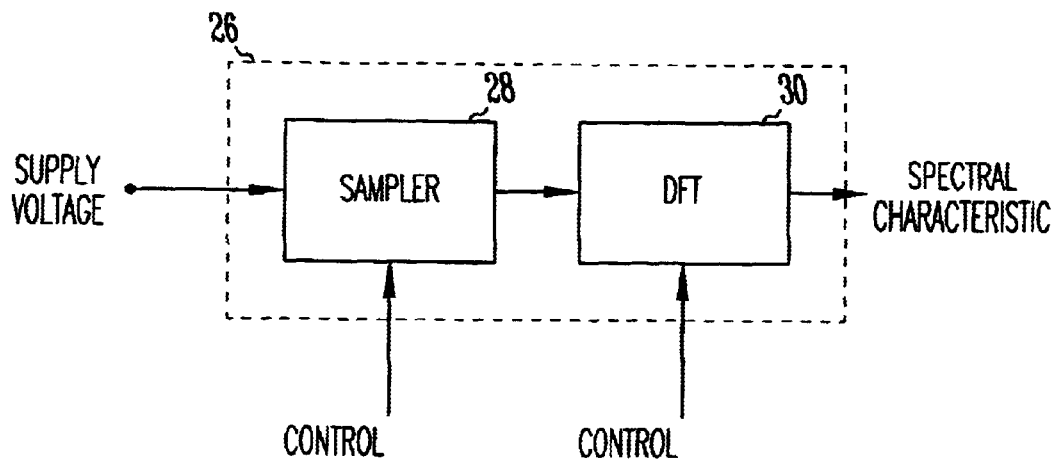
FIGS. 2 and 3 are block digrams illustrating two possible configurations for the spectrum analysis unit of FIG. 1.
Figure 3:
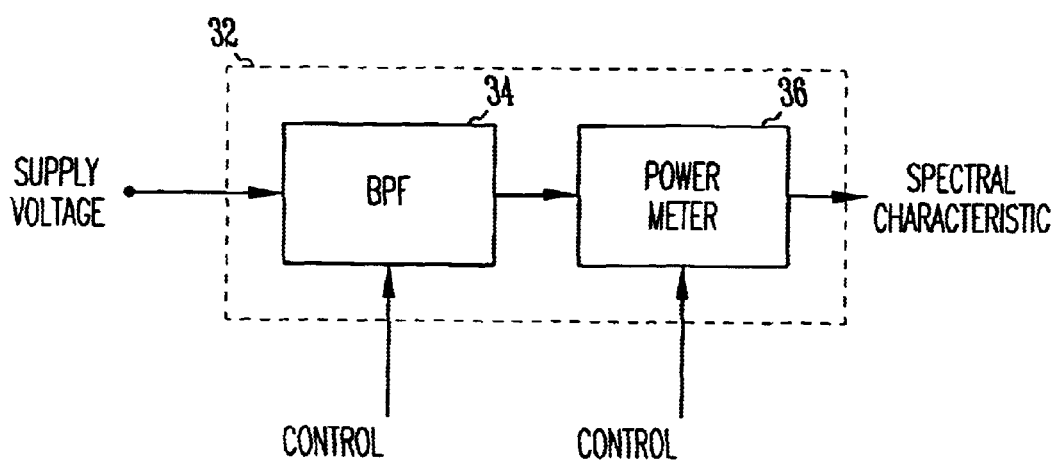

FIGS. 2 and 3 are block diagrams illustrating two possible configurations for the spectrum analysis unit 16 of FIG. 1. FIG. 2 illustrates a spectrum analysis unit 26 that uses Fourier techniques to measure a spectral characteristic of the supply voltage. A sampler 28 samples the supply voltage at a predetermined sampling rate to generate a plurality of sample values. The sample values will preferably be in a digital format, although analog samples can also be used. The sample values are delivered to the input of a discrete Fourier transform (DFT) unit 30 which processes the samples in accordance with DFT theory to generate a frequency domain representation of the sampled signal. In one approach, the DFT 30 will be configured to perform a fast Fourier transform (FFT) operation using the sample values. The frequency domain representation generated by the DFT unit 30 will include a number of individual spectral components located at discrete, equal-spaced frequencies (i.e., a fundamental frequency and a number of harmonics). Each of these spectral components will have an associated magnitude value that is related to the power being delivered to the DUT 22 at the corresponding frequency. The number of spectral components will normally equal the number of samples that were input into the DFT unit 30. The frequencies of the spectral components are related to the sampling rate of the sampler 28. The sampler 28 will preferably sample the supply voltage using its maximum sampling rate. As discussed previously, in one approach, the spectrum analysis unit 26 will measure the spectral characteristic(s) of the supply voltage within a specific time window during the predetermined operational sequence of the DUT 22. Thus, the sampler 28 will only sample the supply voltage during this time window. After the DFT operation has been performed, the spectrum analysis unit 26 will transfer one or more of the magnitude values of the resulting spectral components (or derivatives thereof) to the comparison unit 8 for comparison with the predetermined test criterion. It has been found that the lower frequency spectral components (e.g., the fundamental frequency and the first and second harmonics) generated by the DFT unit 30 are generally better at predicting the presence of defects within the DUT 22 than are the higher frequency components.

FIG. 3 illustrates a spectrum analysis unit 32 that uses a filter to measure a spectral characteristic of the supply voltage. A band-pass filter (BFP) 34 processes the supply voltage of the DUT 22 to isolate a relatively narrow band of frequencies within the signal. The filtered signal is then transferred to the power meter 36 which measures a power level associated with the narrow band of frequencies. The power level measured by the power meter 36 (or a derivative thereof) is then delivered to the comparison unit 18 for comparison with the predetermined test criterion. The BPF 34 and the power meter 36 can be implemented using either digital or analog techniques. As before, the measurement of the spectral characteristic of the supply voltage by the spectral analysis unit 32 can be limited to s specific time window during the predetermined operational sequence of the DUT 22.

As described previously, the comparison unit 18 compares the spectral characteristic measured by the spectrum analysis unit 16 to a predetermined test criterion to determine whether a defect is likely to exist within the DUT 22. The predetermined test criterion can include, for example, a threshold value which "good" circuits should not exceed (or go below) or a range of values within which "good" circuits should fall. The form of the predetermined test criterion will normally depend upon the type of spectral characteristic being measured. The predetermined test criterion will preferably be statistically derived based on spectral measurements performed on a large quantity of circuits. In one approach, for example, a number of circuits that are known to be defect-free are processed to measure one or more spectral characteristics of each of the circuits (e.g., as described above for the DUT 22). This spectral information is then evaluated statistically to derive a threshold value that a defective device will typically exceed. If the measured spectral characteristic of the DUT 22 exceeds this threshold value, therefore, the DUT 22 is deemed defective.

In one approach, the comparison unit 18 will include a simple logic comparator circuit to compare a measured spectral characteristic to a threshold value. In another approach, a more complex software-based comparison procedure is implemented. As will be apparent to a person of ordinary skill in the art, many alternative comparison schemes can be used. As described above, in at least one embodiment of the invention, the spectrum analysis unit 16 will deliver multiple spectral characteristic values of the comparison unit 18 for a single DUT 22. The comparison unit 18 can be adapted to compare each of these measured values to a corresponding test criterion. The test criterion can be the same for each of the measured values or a different test criterion can be specified for two or more of the measured values. By analyzing multiple spectral characteristics of the supply voltage, greater defect detection accuracy can often be achieved.

Figure 4:
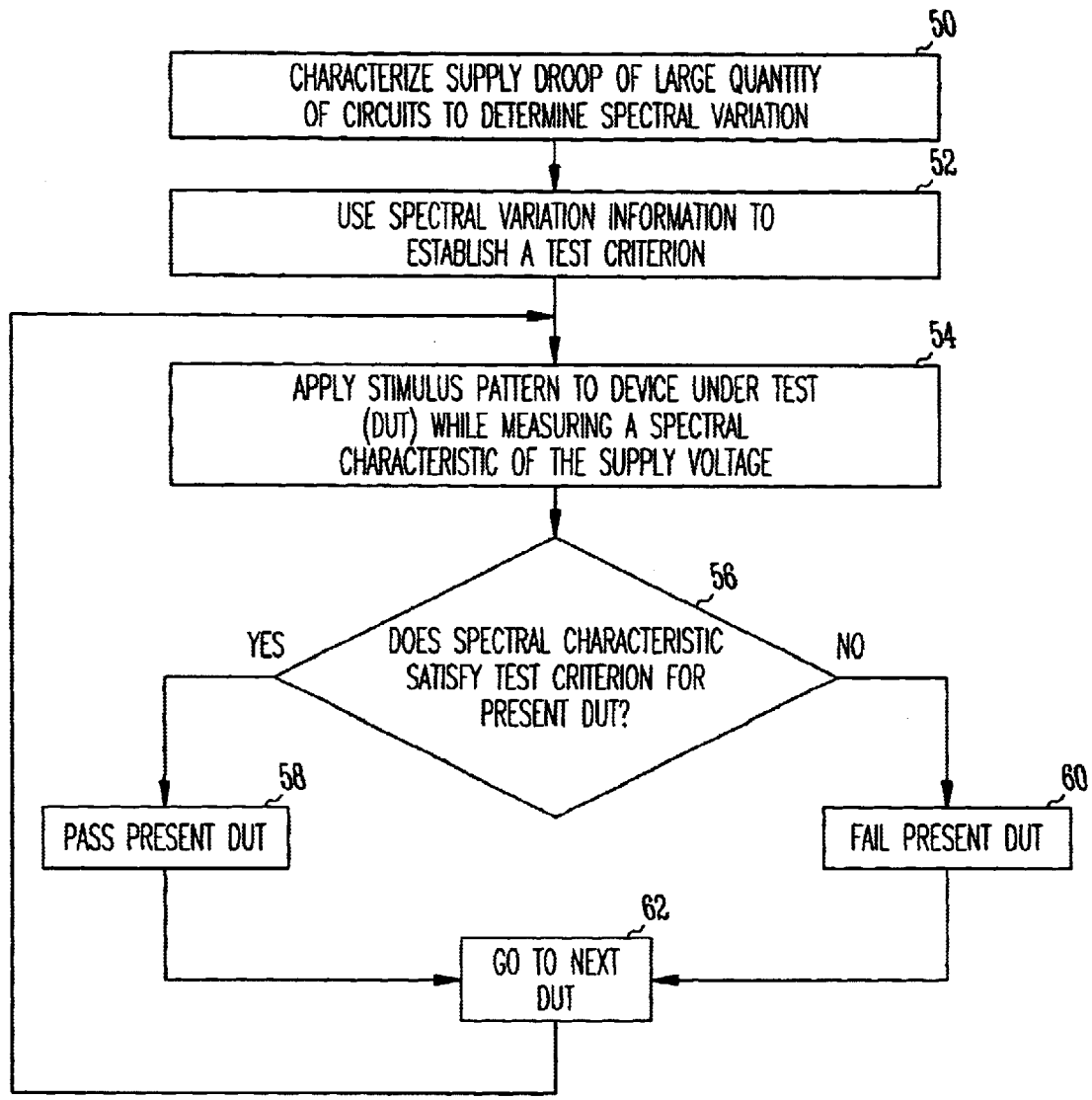
FIG. 4 is a flowchart illustrating a method for testing circuits in accordance with one embodiment of the present invention.

FIG. 4 is a flowchart illustrating a method for testing circuits in accordance with one embodiment of the present invention. Firstly, the supply droop of a large quantity of circuits is characterized to determine a spectral variation between the circuits (block 50). In one approach, the circuits that are tested will all be circuits that are known to include no defects. The spectral variation information is then used to establish a test criterion for circuits of that type (block 52). A stimulus pattern is subsequently applied to a first DUT while a spectral characteristic of the DUT is measured (block 54). It is then determined whether the measured spectral characteristic value satisfies the established test criterion for the present DUT (block 56). If the measured characteristic value satisfies the test criterion, the present DUT is passed (block 58). If the measured characteristic value does not satisfy the test criterion, the present DUT is failed (block 60). In either case, the method then proceeds to the next DUT (block 62).

Although the present invention has been described in conjunction with certain embodiments, it is to be understood that modifications and variation may be resorted to without departing from the spirit and scope of the invention as those skilled in the art readily understand. Such modifications and variations are considered to be within the purview and scope of the invention and the appended claims.

What is claimed is:

1. A method for detecting a defect within a circuit, comprising:

applying a predetermined stimulus pattern to a device under test (DUT);

measuring a spectral characteristic of a supply voltage on the DUT while said predetermined stimulus pattern is being applied to said DUT; and comparing said spectral characteristic to a predetermined test criterion.

2. The method claimed in claim 1, wherein:

measuring a spectral characteristic includes sampling said supply voltage at a predetermined sampling rate to generate sample values.

3. The method claimed in claim 2, wherein:

sampling said supply voltage includes collecting samples within a predetermined time window.

4. The method claimed in claim 2, wherein:

measuring a spectral characteristic includes performing a Fourier transform using said sample values.

5. The method claimed in claim 1, wherein:

measuring a spectral characteristic includes measuring a power level associated with a predetermined range of frequencies within a spectrum of said supply voltage.

6. The method claimed in claim 5, wherein:

comparing said spectral characteristic includes comparing said power level to a threshold value.

7. The method claimed in claim 1, wherein:

applying a predetermined stimulus pattern to said DUT includes applying a stimulus pattern that operates said DUT at an operational speed that is significantly less than a maximum operational speed of said DUT.

8. A test system for detecting a defect in a circuit, comprising:

a voltage supply to provide a supply voltage to a device under test (DUT);

a stimulus pattern generator to apply a stimulus pattern to the DUT;

a spectrum analysis unit to measure a spectral characteristic of the supply voltage while the stimulus pattern is being applied to the DUT; and a comparison unit to compare the spectral characteristic measured by the spectrum analysis unit to a predetermined test criterion to determine whether a defect is likely to exist within the DUT.

9. The test system claimed in claim 8, wherein:

said stimulus pattern generator generates a stimulus pattern that operates the DUT at a speed that is below a normal operating speed of the DUT.

10. The test system claimed in claim 8, wherein:

said spectrum analysis unit measures a power level associated with a predetermined frequency of the supply voltage.

11. The test system claimed in claim 8, wherein:

said spectrum analysis unit includes a sampler to sample the supply voltage at a predetermined sampling rate to generate sample values.

12. The test system claimed in claim 11, wherein:

said spectrum analysis unit includes a transform unit to perform a discrete Fourier transform operation using said sample values.

13. The test system claimed in claim 12, wherein:

said transform unit generates a plurality of discrete frequency spectral components using said sample values, each of said plurality of discrete frequency spectral components having a magnitude, wherein said comparison unit compares the magnitude of at least one of said discrete frequency spectral components to a test criterion.

14. The test system claimed in claim 11, wherein:

said sampler samples the supply voltage within a predetermined time window during application of said stimulus pattern.

15. The test system claimed in claim 8, wherein:

said spectrum analysis unit includes a band-pass filter to isolate a range of frequencies within said supply voltage, said band-pass filter having an output signal including said isolated range of frequencies.

16. The test system claimed in claim 15, wherein:

said spectrum analysis unit includes a meter coupled to said band-pass filter to measure a characteristic of said output signal of said band-pass filter.

17. The test system claimed in claim 16, wherein:

said meter measures a power level associated with said output signal.

18. A method for detecting a defect within a circuit, comprising:

determining a spectral test criterion for a device under test (DUT);

measuring a spectral characteristic of a supply voltage being applied to the DUT; and comparing said spectral characteristic to said spectral test criterion to determine whether a defect is likely to exist within the DUT.

19. The method claimed in claim 18, wherein:

determining a spectral test criterion includes measuring a spectral characteristic of a supply voltage for a plurality of circuits that are known to be defect-free to determine a spectral variation for the plurality of circuits and developing said spectral test criterion based on said spectral variation.

20. The method claimed in claim 18, wherein:

measuring a spectral characteristic includes measuring a characteristic associated with a predetermined frequency or range of frequencies within said supply voltage.

21. The method claimed in claim 20, wherein:

said characteristic includes a power being delivered to said DUT at said predetermined frequency or range of frequencies.

* * * * *